United States Patent

Hirano

[11] Patent Number: 5,910,918
[45] Date of Patent: Jun. 8, 1999

[54] DATA WRITING CIRCUIT FOR A NONVOLATILE SEMICONDUCTOR MEMORY

[75] Inventor: Yasuaki Hirano, Yamatokoriyama, Japan

[73] Assignee: Sharp Kabushiki Kaisha, Osaka, Japan

[21] Appl. No.: 08/924,417

[22] Filed: Aug. 27, 1997

[30] Foreign Application Priority Data

Dec. 25, 1996  [JP]  Japan ................................. 8-345765

[51] Int. Cl.⁶ .................................................. G11C 16/04
[52] U.S. Cl. ........................ 365/189.01; 365/185.16; 365/189.05; 365/185.29; 365/218
[58] Field of Search .............................. 365/185.17, 185, 365/185.22, 203, 185.13, 185.16, 185.29, 185.01, 189.01, 154, 189.04, 218, 189.05, 185.14

[56] References Cited

U.S. PATENT DOCUMENTS

| | | | |
|---|---|---|---|
| 5,051,956 | 9/1991 | Burns | 365/185 |
| 5,465,235 | 11/1995 | Miyamoto | 365/203 |
| 5,473,563 | 12/1995 | Suh et al. | 365/185.13 |
| 5,541,879 | 7/1996 | Suh et al. | 365/185.22 |
| 5,751,634 | 5/1998 | Itoh | 365/185.17 |

OTHER PUBLICATIONS

Kobayashi, et al., "Memory Array Architecture and Decoding Scheme for 3V Only Sector Erasable DINOR Flash Memory" *IEEE J. of Solid–State Circuits* 29(4):454–460 (1994).

Kobayashi, et al., "A 3.3V Only 16Mb DINOR Flash Memory" *Inst. of Electronics, Information and Communication Engineers,* ICD95–38: 55–62 (1995). (Abstract only in English).

*Primary Examiner*—David Nelms
*Assistant Examiner*—Thong Le
*Attorney, Agent, or Firm*—Morrison & Foerster, LLP

[57] ABSTRACT

A data writing circuit includes: a transfer gate (TG) selecting a bit line (BL0) of a virtually grounded cell array; a latch circuit (L) connected to the bit line (BL0) via the transfer gate (TG) for latching the data to be written, given to the bit line; a switching circuit (PM) which is connected between the bit line (BL0) and a program power source (VFROG) and is activated in accordance with the data to be written which has been latched by the latch circuit (L), to thereby supply the program power source ($V_{PROG}$) to the bit line (BL0). This circuit, in accordance with the data to be written, sets the bit line (BL0) to which a memory cell (M) is connected, to a state of being applied by the program power source ($V_{PROG}$) or a floating state.

8 Claims, 8 Drawing Sheets

Configuration of a conventional NOR type flash memory cell array

Conventional program circuit

DATA WRITING CIRCUIT FOR A NONVOLATILE SEMICONDUCTOR MEMORY

BACKGROUND OF THE INVENTION

(1) Field of the Invention

The present invention relates to a data writing circuit for a nonvolatile semiconductor memory such as a flash memory etc., in particular relating to a data writing circuit for a nonvolatile semiconductor memory having a virtually grounded memory cell array.

(2) Description of the Prior Art

As one type of nonvolatile semiconductors, flash memories have been conventionally known in which written data can be electrically erased in whole or in part (in blocks as the units). This flash memory is composed of memory cells for storing one bit of data as a minimum unit, made up of a MOS (metal-oxide-semiconductor) field effect transistor with a floating gate (to be referred to hereinbelow as 'memory cell' for simplicity) having a sectional structure as shown in FIG. 1.

Illustratively, the memory cell shown in the figure is produced by selectively diffusing a n-type dopant such as arsenic (atomic symbol: As) or the like onto the principal plane of a semiconductor substrate S of p-type, for example, to form the source S and drain D, and then forming layers of a tunnel oxide film (not coded), a floating gate FG and inter-layer insulating film (not coded) and a control gate CG, in this sequential order, on the substrate principal surface in the channel forming region between the source S and drain D. In the thus configured memory cell, the apparent threshold voltage $V_{thc}$ of the memory cell is varied by drawing or injecting electrons with respect to the floating gate FG to thereby write or erase data. Hereinbelow, a reference to 'transistor' means a field effect transistor.

In the above case, data '0' written in a memory cell corresponds to the state where the threshold voltage $V_{thc}$ is made high in the memory cell (state where electrons have been injected therein), and data '1' corresponds to the state where the threshold voltage $V_{thc}$ is made low (state where electrons have been drawn therefrom). Accordingly, when data is erased in whole, all the memory cells are initialized to the data state '0'. When data is written in, all the data is erased and then electrons are drawn from selective floating gates FG from memory cells in which data '1' should be written.

A type of memory cell has been disclosed in, for example, "Memory Array Architecture and Decoding Scheme for 3 V Only Sector Erasable DINOR Flash Memory" (IEEE, J. Solid-State Circuits, vol.29, No.4. pp.454–460, April 1994) and in "16 Mbit DINOR Flash Memory for 3.3 V single power source" (The Journal of the Institute of Electronics, Information and Communication Engineers, ICD95-38, pp.55–62, 1995). This memory cell uses a type of tunnel current, namely, Fowler-Nordheim Current (to be referred to as 'FN current').

In this memory cell, with respect to the floating gate FD, electrons are drawn through the drain D side by the FN current to selectively write data '1' while electrons are injected through the source S side also by the FN current to erase data '1' (to initialize the cell to data '0'). Conditions of the applied voltages for each operational mode are shown in Table 1.

TABLE 1

| Operation mode | Control gate | Drain | Source | Substrate (p-type well) |
|---|---|---|---|---|
| Program | −8 V | 4 V/0 V | Floating | 0 V |
| Erase | 10 V | Floating | −8 V | −8 V |
| Read | 3 V | about 1 V | 0 V | 0 V |

As shown in Table 1, when data '1' is written in to this memory cell, a negative voltage $V_{nw}$ (e.g. −8 V) is applied to the control gate CG and a positive voltage $V_{pp}$, (e.g. +4 V) to the drain D with the source S floating, so that a high electric field reaches from the drain D to the floating gate FG to generate an FN current. Thus, electrons are drawn from the floating gate FG toward the drain D to thereby lower the threshold voltage $V_{thc}$ of the memory cell to about 1.5 V thus writing data '1'.

When the data '1' thus written in is erased, a positive voltage $V_{pe}$ (e.g. +10 V) is applied to the control gate CG and a negative voltage $V_{ns}$ (e.g. −8 V) to the source S with the drain D floating, so that electrons are injected from the source S side and the substrate to the floating gate by the FN current, to thereby increase the threshold voltage $V_{thc}$ of the memory cell which has been made low, to about 3 V or above, thus initializing the cell to data '0'.

Further, when the written data is read out from the memory cell, a source voltage $V_{cc}$ (e.g. 3 V) is applied to the control gate CG, a bias voltage $V_{bias}$ (e.g. 1 V) to the drain D and a ground voltage $V_{ss}$ (0 V) to the source S, and the drain current $I_d$ flowing through the memory cell is detected and read. That is, when the threshold voltage $V_{thc}$ of the memory cell is varied by writing data (by drawing or injecting electrons), the drain current $I_d$ flowing through the memory cell varies. Therefore, it is possible to read out the written data by detecting the drain current $I_d$ flowing through the memory cell.

In general, in a flash memory, as shown in FIG. 2, an NOR type cell array is formed of memory cells 00 to nn for which data is written in, read out or erased using the aforementioned FN current. Now, data writing, erasing and reading operations will be explained exemplifying a memory cell 00 as an element of the NOR type cell array shown in FIG. 2.

In this figure, when data '1' is written in to memory cell 00, $V_{nw}$ (−8 V) is applied to word line WL0, a voltage $V_{pp}$ (+4 V) to bit line BL0 with common source line SL floating. In this condition, a high electric field is generated which derives from the drain toward the floating gate in memory cell 00 and electrons are drawn from the floating gate toward the drain by the FN current, to thereby lower the threshold voltage of memory cell 00.

When the data to be written is '0', ground voltage $V_{ss}$ (0 V), in place of the aforementioned $V_{pp}$ is applied to bit line BL0. In this case, the electric field between the floating gate and drain in memory cell 00 becomes low, so that no FN current will flow. Accordingly, no electrons are drawn from the floating gate, therefore its threshold voltage $V_{thc}$ is maintained at 3 V or above (the initialized data '0' is maintained).

Next, when the written data is erased, a positive high voltage $V_{pe}$ (+10 V) is applied to all the word lines WL0 to WLn (the control gate of each memory cell), a negative voltage $V_{ns}$ (−8 V) applied to the common source lines SL (the source of each memory cell) and the substrate with all the bit lines BL0 to BLn (the drain of each memory cell)

floating. In this setting, in all the memory cells inclusive of memory cell 00, a high electric field is generated between the source, or the substrate, and the floating gate, so that electrons are injected into each floating gate FG. As a result, the threshold voltages for all the memory cells are increased so that each memory cell reverts to the initialized state or the state of data '0'.

Next, when the data is read out from memory cell 00 (inclusive of the case of verification), a read bias voltage $V_{bias}$ (about 1 V) is applied to bit line BL0, ground voltage $V_{ss}$ (0 V) to the common source line SL, and $V_{cc}$ (3 V) to word line WL0, to detect the drain current $I_d$. In this detection, if the drain current $I_d$ is high, the data is read out from the memory cell as it is judged to be '1', whereas if the drain current $I_d$ is low, the data is judged to be data '0'.

Referring now to FIG. 3, explanation will be made of a conventional data writing circuit for writing data into memory cells constituting of the aforementioned NOR type cell array. A conventional data writing circuit 100 shown in this figure, is composed of a transfer gate TG for selecting a bit line BL connected to the drain of a memory cell M in accordance with a column selection signal Y given from an unillustrated decoder and a latch circuit L connected to the bit line BL via this transfer gate TG. This latch circuit L is a flip-flop composed of two inverters (not coded) with their inputs and outputs cross-coupled with each other. The power source for these inverters (the flip-flop) is switched between voltage $V_{pp}$ (e.g. +4 V) and the power source voltage $V_{cc}$ (e.g. +3 V) in accordance with the operation mode.

Now, when data '1' is written in to the memory cell M shown in FIG. 3, first the power voltage $V_{cc}$ (+3 V) is set as the power source for the inverters forming latch circuit L, so as to latch data '1' supplied from an unillustrated data driver. Next, when the power source to the inverters is changed to the voltage $V_{pp}$ (+4 V) and the transfer gate TG is turned on, a voltage in accordance with the data which has been latched by latch circuit L is applied to bit line BL.

In this case, the data which has been latched by latch circuit L is '1', so that node A of the flip-flop becomes stabilized at voltage $V_{pp}$ (+4 V). In this state, if the column selection signal Y given to the gate of transfer gate TG is boosted, this transfer gate TG, without undergoing any voltage drop due to its threshold voltage, transfers the voltage at node A to bit line BL. Accordingly, voltage $V_{pp}$ (+4 V) at node A of the flip-flop is applied as it is to bit line BL. When the data which has been latched by latch circuit L is '0', the potential at node A becomes stabilized to ground voltage $V_{ss}$ (0 V), which in turn is applied to bit line BL.

In this way, the voltage to be applied to bit line BL is selected in accordance with the data to thereby determine the intensity of the electric field between the floating gate and drain in the memory cell. As a result, if this electric field is strong, electrons are drawn and data '1' will be recorded into the cell, whereas, if this electric field is weak, no extraction of electrons will occur, and record data '0' will be recorded (the initial data '0' is maintained).

In the aforementioned NOR type cell array shown in FIG. 2, all the source terminals from memory cells 00 to nn are connected to common source line SL, which needs its wiring area inside the cell array. This is an obstacle to reducing the area of the memory array.

To deal with this, for an NOR type cell array having such a common source line, there is a configuration as shown in FIG. 4, called a virtually grounded cell array, in which the aforementioned common source line SL is eliminated by connecting the drain of one cell to the source of the adjacent cell with a common bit line between the adjacent memory cells. This configuration has been adopted for some EPROMs (erasable programmable ROMs) etc.

Now, this virtually grounded cell array shown in FIG. 4 will be explained. When such a virtually grounded cell array is applied to a flash memory, the memory cell needs to have at least the following characteristics: That is, in the memory cell, the data needs to be written in using a first voltage relationship between the control gate and one of either the drain or source, and the memory cell needs to be insensitive to a second voltage relationship between the control gate and the other of the drain or source except for the readout operation. In this case, 'source' here is the one defined based on the voltage application conditions at the time of data readout.

One example of a memory cell having these characteristics, is sectionally shown in FIGS. 5A and 5B. The memory cell shown in the figures has a low dopant concentration on the source side in proximity to the channel forming area and a high dopant concentration on the drain side in proximity thereto. In a memory cell having such a structure, as a result of the difference in dopant concentration between the source and the drain, the depletion region formed is greater when, for example, 4 V is applied to the source than when the same voltage, i.e., 4 V is applied to the drain, as shown in FIG. 5B. For this reason, no overlap area appears because of the formation of the depletion layer between the floating gate and the source, and consequently, the electric field therebetween is reduced, to thereby inhibit the generation of the FN current.

As shown in the same figure, on the drain side where the dopant concentration is high, the development of the depletion region is inhibited. Accordingly, an overlap area is generated between the floating gate and the source, so that a high electric field is generated therebetween causing the FN current. Thus, in the case of the memory cell shown in FIGS. 5A and 5B, no electrons are drawn from the source side. This means that the cell presents the property of insensitiveness to the voltage relationship between the control gate and the source with respect to the writing operation. Here, when the distribution relationship of the dopant concentration in the source and drain is reversed, it is possible to create a cell which is insensitive to the voltage relationship between the control gate and the drain with respect to the writing operation.

Another memory cell presenting similar characteristics to that shown in FIGS. 5A and 5B, is shown in FIG. 5C. The memory cell in this figure, has a high dopant density in both the source and the drain with the thickness of the gate oxide film on the drain side formed thinner than that on the source side. In this way, by varying the film thickness of the gate oxide film between the source side and the drain side, it is possible to selectively enhance only the electric field between the drain and the floating gate, thus making it possible to obtain a memory cell which is insensitive to the voltage relationship between the control gate and the source with respect to the writing operation.

Table 2 shows the conditions of the application voltages to the memory cell in FIGS. 5A and 5B in different operation modes.

TABLE 2

| Operation mode | Control gate | Drain | Source | Substrate (p-type well) |
|---|---|---|---|---|
| Program | −8 V | 4 V/* | 4 V/* | 0 V |
| Erase | 10 V | −8 V | −8 V | −8 V |
| Read | 3 V | 0 V | 1 V | 0 V |

*Floating or about 1 V

Next, description will be made of the operation of writing data into a virtually grounded cell array shown in FIG. 4 composed of memory cells having the above characteristics. Concerning a symbol of the memory cells shown in FIG. 4, the node with an oblique line corresponds to the source (the region with a low dopant concentration) in FIG. 5B.

Generally, in the case of a flash memory which uses the FN current for its writing operation, in order to reduce the time for writing, so-called multi-byte write method is used which allows simultaneous writing operations to a plurality of memory cells connected to a single word line. Therefore, the voltage to each of bit lines BL0 to BLn during writing is applied in accordance with the type of data to be written into the memory cell which is connected to the bit line.

However, in this case, differing from the case of the aforementioned NOR type cell array, the writing voltage applied to the bit lines to which the drain of the memory cell to be written in with data '0' is connected, needs to be set at the state of floating or at about +1 V, instead of voltage $V_{ss}$ (0 V) in order to avoid inhibiting the adjacent cell from being written in with data '1'. This will be detailed later.

Now, referring to Table 2 showing conditions of application voltages in different operational modes, the write, erase and read operations for memory cell 00 shown in FIG. 4 will be described. First, when data '1' is written in to memory cell 00, a negative voltage $V_{nw}$ (e.g. −8 V) is applied to word line WL0 (the control gate in the memory cell) and a positive voltage $V_{pp}$ (e.g. +4 V) to bit line BL0 (the drain in the memory cell). At this moment, applied to the source of memory cell 00, or bit line BL1 is voltage $V_{pp}$ (+4 V) when the data to be written into the adjacent memory cell 01 is '1', whereas the floating state or about 1 V is set up for the case of data '0' (it should be noted that this is not voltage $V_{ss}$ (0 V)).

When memory cell 00 is biased under such write voltage conditions, the aforementioned FN current flows between the floating gate and drain so that electrons are drawn from the floating gate toward the drain side. As a result, threshold voltage $V_{thc}$ of memory cell 00 lowers, and hence data '1' is written in to the memory cell 00. However, at this moment, if the voltage $V_{ss}$ (0 V) is applied without the source being floating, sufficient quantity of electrons cannot be drawn from the floating gate, and hence a phenomenon occurs that data '1' cannot be written in.

Now, this phenomenon will be explained with reference to FIG. 6. FIG. 6 shows the dependence of the threshold voltage of the memory cell upon the time for writing data '1' when the source voltage is taken as a parameter with the drain voltage set at 4 V. As seen from the chart, concerning the write characteristics of the memory cell, the threshold voltage lowers more slowly and hence the time for writing data '1' becomes longer when the source voltage is set at 0 V than when the source is set at +1 V or is set at floating.

The cause of this phenomenon resides in that as a result of extracting electrons from the floating gate in order to write data '1', the potential of the floating gate will rise and hence threshold voltage $V_{thc}$ will lower. Actually, when threshold voltage $V_{thc}$ lowers due to the extraction of electrons from the floating gate, a channel is formed between the drain and source in the memory so that current flows therebetween. Thus the potential at the drain lowers under the influence of the source side. As a result, the electric field between the drain and the floating gate is reduced, which inhibits the FN current (the reduction of threshold voltage $V_{th}$ is inhibited), thereby the time for writing data '1' becomes longer. In the worst case, the threshold voltage of the memory cell cannot be lowered to a prescribed level that allows the distinction of data '1', or it becomes impossible to write data '1' normally.

In contrast, in the case where the source of the memory cell is set at floating, when electrons are drawn from the floating gate and a channel is formed allowing current to flow from the drain to the source, the source potential gradually increases. With this increase in the source potential, the potential at the control gate relatively lowers, and this inhibits the current from the drain to the source. This current inhibition in combination with an extra effect, namely, the back gate effect due to the increase of the source potential, will block the channel in the memory cell. When the channel in the memory cell shuts down, the drain potential restores to its original state, so that a high electric field is produced between the drain and the floating gate, thus allowing the normal writing of data '1'.

Further, in this case, if the source is biased with a voltage, e.g. about +1 V, instead of setting the source of the memory cell at the floating state, the back gate effect is effective from the start of the write operation, thereby efficiently inhibiting a channel from forming. Therefore, it is possible to prevent the reduction in the drain voltage from the beginning of the write operation. Accordingly, in this case, it is possible to write data '1' in a shorter time.

Next, when data '0' is written in to the memory cell 00 shown in FIG. 4 (in this case, the memory cell 00 is assumed to be initialized), bit line BL0 is set at the floating state (or at about +1 V). Here, the potential at BL1 is set at voltage $V_{pp}$ (+4 V) or at the floating state (or about +1 V) in accordance with the data to be written into the memory cell 01. As the reason already mentioned, application of ground voltage $V_{ss}$ (0 V) to the bit line is prohibited.

In this case, even if, in order to write data '1' to the adjacent memory cell 01, voltage $V_{pp}$ (+4 V) is applied to bit line BL1 to which the source of memory cell 00 is connected, no electrons are drawn from the floating gate of memory cell 00 toward the source (bit line BLI) side because the write characteristics of the memory cell is set to be insensitive to the voltage on the source side. That is, the operation of writing data '0' to memory cell 00 will not be affected by the write operation to memory cell 01.

Next, when data is retrieved from memory cell 00, basically, similar bias conditions to that in a conventional NOR type array are set up. Specifically, $V_{cc}$ (+3 V) is applied to word line WL0 (control gate), $V_{bias}$ (+1 V) to bit line BL0 (drain), and $V_{ss}$ (0 V) to bit line BL1 (source). In this setup, the drain current $I_d$ is detected so as to read the data out.

Next, when the data written in the memory cell is eased, a positive high voltage $V_{pe}$ (e.g. +10 V) is applied to all the word lines WL0 to WLn, and a negative voltage $V_{ns}$ (e.g. −8 V) is applied to all the bit lines BL0 to 0n and to the substrate, so that electrons are as a whole injected into individual floating gates of all the memory cells 00 to nn through the drain and substrate region by the FN current. As a result, in each memory cell, the threshold voltage is increased to about 3 V or more, which means the initialization or the state of data '0'.

However, when the conventional circuit 100 shown in FIG. 3 is used as the data writing circuit for writing data into the memory cells constituting the aforementioned virtually grounded cell array, when ground voltage $V_{ss}$ (0 V) must be applied to the bit line to write data '0'. This causes the problem as stated above in that it becomes impossible to write data '1' into the memory cells whose source is connected to this bit line.

SUMMARY OF THE INVENTION

The present invention has been devised in view of the above problems, and it is therefore an object of the present invention to provide a data writing circuit for a nonvolatile semiconductor memory, which can perform a high-speed stable operation of writing data into a virtually grounded cell array made up of memory cells in which data is written in and eased by the Fowler-Nordheim tunnel current.

In order to achieve the above object, the present invention is configurated as follows:

In accordance with the first aspect of the invention, a data writing circuit for a nonvolatile semiconductor memory comprising a virtually grounded cell array composed of floating gate type memory cells in which data is written in and erased based on the Fowler-Nordheim tunnel effect, includes: a transfer gate selecting a bit line of the virtually grounded cell array; a latch circuit connected to the bit line via the transfer gate for latching the data to be written, given to the bit line; and a switching circuit which is connected between the bit line and a program power source and is activated in accordance with the write data which has been latched by the latch circuit, to thereby supply the program power source to the bit line.

In accordance with the second aspect of the invention, a data writing circuit for a nonvolatile semiconductor memory comprising a virtually grounded cell array composed of floating gate type memory cells in which data is written in and erased based on the Fowler-Nordheim tunnel effect, includes: a transfer gate selecting a first bit line of the virtually grounded cell array; a latch circuit connected to the first bit line via the transfer gate for latching the data to be written, given to the first bit line; and a switching circuit which is connected between a second bit line adjacent to the first bit line and a program power source and is activated in accordance with the data to be written which has been latched by the latch circuit, to thereby supply the program power source to the second bit line adjacent to the first bit line.

In accordance with the third aspect of the invention, a data writing circuit for a nonvolatile semiconductor memory comprising a virtually grounded cell array composed of floating gate type memory cells in which data is written in and erased based on the Fowler-Nordheim tunnel effect, includes: a transfer gate selecting a bit line of the virtually grounded cell array; a latch circuit connected to the bit line via the transfer gate for latching the data to be written, given to the bit line; and a switching circuit which selects a first or second program power source in accordance with the data to be written which has been latched by the latch circuit, to thereby supply the selected program power source to the bit line.

In accordance with the fourth aspect of the invention, a data writing circuit for a nonvolatile semiconductor memory comprising a virtually grounded cell array composed of floating gate type memory cells in which data is written in and erased based on the Fowler-Nordheim tunnel effect, includes: a transfer gate selecting a first bit line of the virtually grounded cell array; a latch circuit connected to the first bit line via the transfer gate for latching the data to be written, given to the first bit line; and a switching circuit which selects a first or second program power source in accordance with the write data which has been latched by the latch circuit, to thereby supply the selected program power source to a second bit line adjacent to the first bit line.

In accordance with the fifth aspect of the invention, the data writing circuit for a nonvolatile semiconductor memory has the above first feature and is characterized in that the transfer gate is composed of a first conductivity type transistor which is connected at one of either the source or the drain thereof to the bit line; the latch circuit is composed of a flip-flop, of which a first stable point of two is connected to the other of the source and the drain of the first conductivity type transistor; and the switching circuit is composed of a second conductivity type transistor of which the source and drain are connected to the program power source and the bit line, respectively, the gate being connected to the second stable point of the flip-flop.

In accordance with the sixth aspect of the invention, the data writing circuit for a nonvolatile semiconductor memory has the above second feature and is characterized in that the transfer gate is composed of a first conductivity type transistor which is connected at one of either the source or the drain thereof to the bit first line; the latch circuit is composed of a flip-flop, of which a first stable point of two is connected to the other of the source and the drain of the first conductivity type transistor; and the switching circuit is composed of a second conductivity type transistor of which the source and drain are connected to the program power source and the second bit line adjacent to the first bit line, respectively, the gate being connected to the second stable point of the flip-flop.

In accordance with the seventh or eighth aspect of the invention, the data writing circuit for a nonvolatile semiconductor memory has the above fifth or sixth feature, further comprising: a transistor between the gate of the second conductivity type transistor constituting the switching circuit and the second stable point of the flip-flop constituting the latch circuit, the transistor being cut off against a signal which exceeds a predetermined level of voltage, and is characterized in that the self-boosting effect which appears in accordance with the transition of the program power source imparted to the source of the second conductivity type transistor is used to raise the potential of the gate of the second conductivity type transistor to a predetermined level of voltage or higher to thereby cut off the second conductivity type transistor.

The operation of the invention thus configured will be hereinbelow described.

In accordance with the data writing circuit for a nonvolatile semiconductor memory of the first or fifth feature of the invention, for example, data to be written which is imparted to the bit line to which the drain of a memory cell is connected, is given to the latch circuit (flip-flow) via the selected transfer gate (the first conductivity type transistor), so that the latch circuit latches the data to be written.

The switching circuit (the second conductivity type transistor) is turned on in accordance with the data to be written which has been latched by the latch circuit. In this operation, if, for example, the data to be written is '1', the switching circuit is activated so as to supply the program power source to the bit line, thereby controlling the quantity of electrons in the floating gate of the memory cell whose drain is connected to the bit line to which this program power source is supplied.

If the data to be written is '0', the switching circuit remains turned off, the program power source will not be supplied to the bit line (in this case, the bit line is set in floating state relative to the program power source). Accordingly, in this case, the quantity of electrons in floating gate of the memory cell will not be controlled. In this way, by selecting whether the program power source is supplied to the bit line or not, based on the data to be written, the quantity of electrons in the floating gate is controlled from the drain side so as to adjust the threshold voltage of the memory cell, thus writing the data into the memory cell.

In accordance with the data writing circuit for a nonvolatile semiconductor memory of the second or sixth feature of the invention, the switching circuit (the second conductivity type transistor) will be activated based on the data to be written, in the same procedures as in the data writing circuit for a nonvolatile semiconductor memory according to the above first feature. In this operation, if, for example, the data to be written is '1', the program power source is supplied to the second bit line adjacent to the first bit line, or in this case, the bit line which is connected to the source of the memory cell, thereby controlling the quantity of electrons in the floating gate of the memory cell whose source is connected to the second bit line to which this program power source is supplied.

If the data to be written is '0', the program power source will not be supplied to this bit line. Accordingly, the quantity of electrons in floating gate of the memory cell will not be controlled. In this way, by selecting whether the program power source is supplied to the bit line to which the source of the memory cell is connected, based on the data to be written, the quantity of electrons in the floating gate is controlled from the source side so as to adjust the threshold voltage of the memory cell, thus writing the data into the memory cell.

In accordance with the data writing circuit for a nonvolatile semiconductor memory of the third feature of the invention, for example, data to be written which is imparted to the bit line to which the drain of a memory cell is connected, is given to the latch circuit (flip-flow) via the selected transfer gate, so that the latch circuit latches the data to be written. The switching circuit is turned on in accordance with the data to be written which has been latched by the latch circuit. In this operation, if, for example, the data to be written is '1', the switching circuit allows supplying of the first program power source to the bit line, thereby controlling the quantity of electrons in the floating gate of the memory cell whose drain is connected to the bit line to which this program power source is supplied.

If the data to be written is '0', the switching circuit supplies to the bit line the second program power source of a voltage which inhibits a channel from forming in the adjacent memory cell and will not affect the quantity of electrons in the floating gate. Accordingly, the drain potential of the adjacent memory cell whose source is connected to the bit line is efficiently maintained so as to promote the operation of writing data '1' to the memory cell, while data '0' is written in to the memory cell whose drain is connected to the bit line.

In accordance with the data writing circuit for a nonvolatile semiconductor memory of the fourth feature of the invention, the switching circuit will be activated based on the data to be written, in the same procedures as in the data writing circuit for a nonvolatile semiconductor memory according to the above third feature. In this operation, if, for example, the data to be written is '1', the program power source is supplied to the second bit line adjacent to the first bit line, or in this case, the bit line which is connected to the source of the memory cell, thereby controlling the quantity of electrons in the floating gate of the memory cell whose source is connected to the second bit line to which this program power source is supplied.

If the data to be written is '0', the switching circuit supplies to the second bit line (the adjacent bit line) to which the source is connected, the second program power source of a voltage which inhibits a channel from forming in the adjacent memory cell and will not affect the quantity of electrons in the floating gate. Accordingly, the source potential of the adjacent memory cell whose drain is connected to the adjacent bit line is efficiently maintained so as to promote the operation of writing data '1' to the memory cell, while data '0' is written in to the memory cell whose source is connected to the adjacent bit line.

In accordance with the data writing circuit for a nonvolatile semiconductor memory of the seventh or eighth feature of the invention, when the second stable point of the flip-flop is at H-level, the H-level is limited to a predetermined voltage by the transistor which is connected between the second stable point of the flip-flop and the gate of the second conductivity type transistor constituting the switching circuit. The thus limited H-level is imparted to the gate of the second conductivity type transistor.

Next, when the program power voltage is raised, the self-boosting effect resulting from the coupling capacitance between the source and gate of the second conductivity type transistor, causes the potential of the gate to the predetermined voltage or more, the second conductivity type transistor is totally cut off. Accordingly, even if the H-level at the second stable point of the flip-flop is lower than the program power source voltage, the second conductivity type transistor is cut off, thus data '0' is written in to the memory cell.

DESCRIPTION OF THE PREFERRED EMBODIMENTS

The First Embodiment

Figure 7:
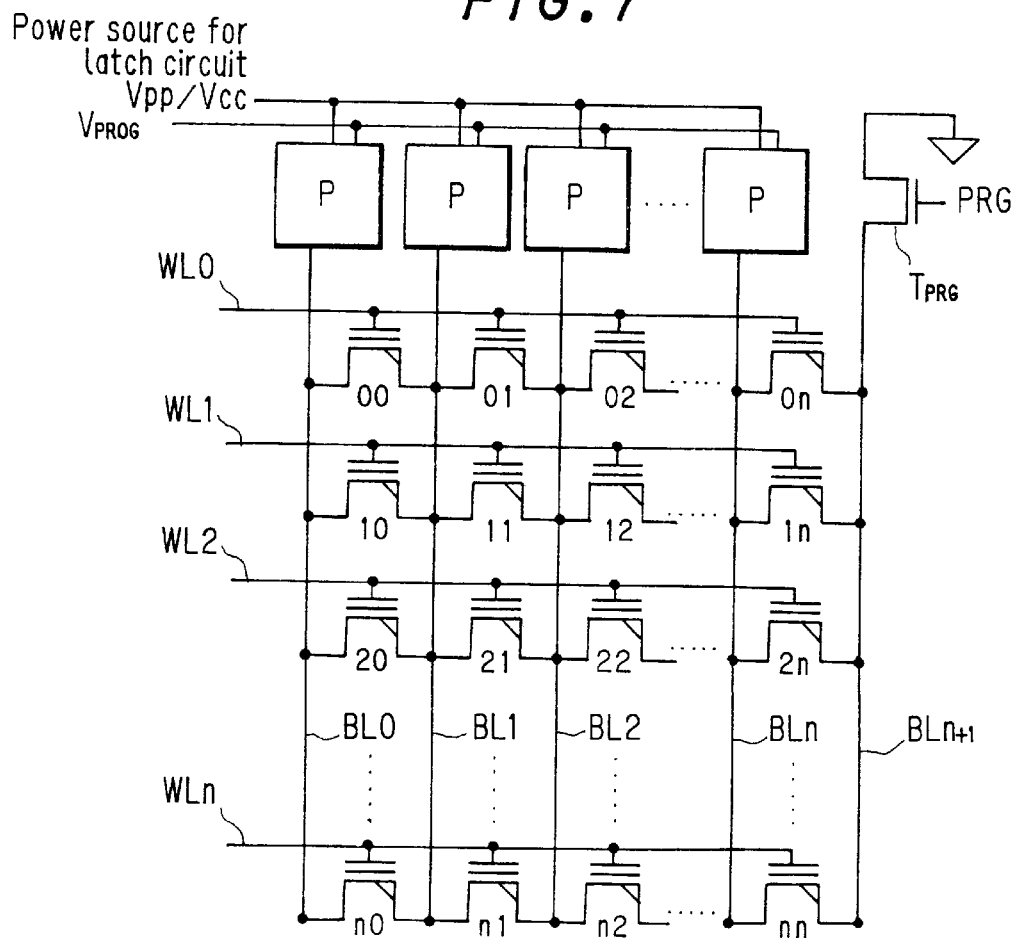
FIG. 7 is a circuit diagram showing connections of data writing circuits of the first embodiment with a virtually grounded cell array.
Figure 8A:
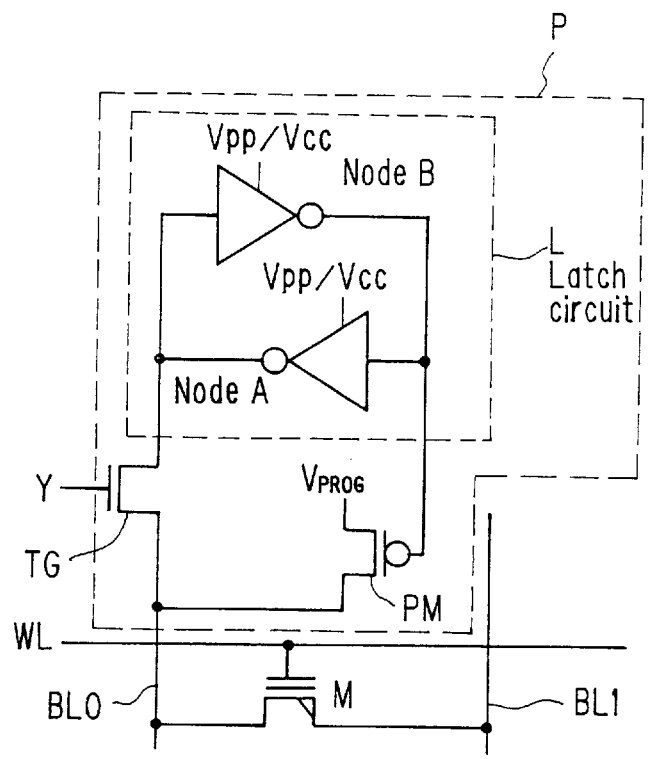
FIGS. 8A and 8B are circuit diagrams showing data writing circuits in accordance with the first embodiment.
Figure 8B:
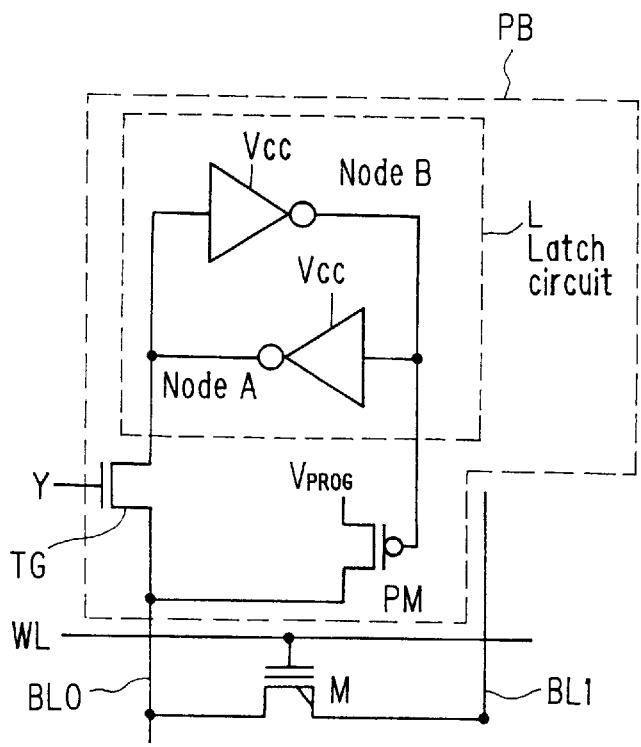

Referring to FIG. 7 and FIGS. 8A and 8B, description will be made of a data writing circuit for a nonvolatile semiconductor memory in accordance with the first embodiment of the invention.

Figure 4:
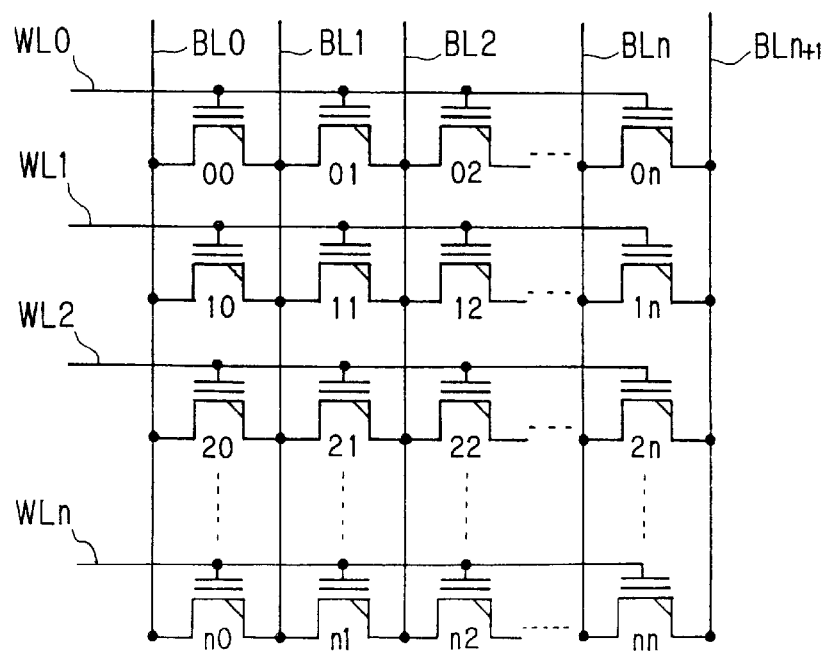
FIG. 4 is a view showing a configuration of a virtually grounded cell array composed of floating gate type memory cells.

As shown in FIG. 7, one data writing circuit P of this embodiment is provided to each bit line of a cell array having a similar configuration of the virtually grounded cell array shown in FIG. 4, so that data can be written in simultaneously to a plurality of memory cells connected to one word line. In FIG. 7, all the source terminals of memory cells $0n$, $1n$, ..., $nn$ located at the line end (on the leftmost side) are commonly connected to the ground via an n-type transistor $T_{PRG}$, which is turned on by setting the signal PRG at 'H' when data needs to be read out, to thereby ground the source terminals of these memory cells.

Figure 1:
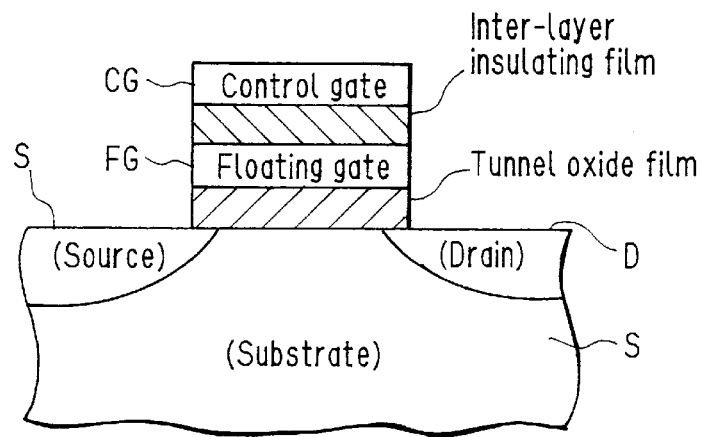
FIG. 1 is a sectional view of structure showing a memory cell of a floating gate type.
Figure 2:
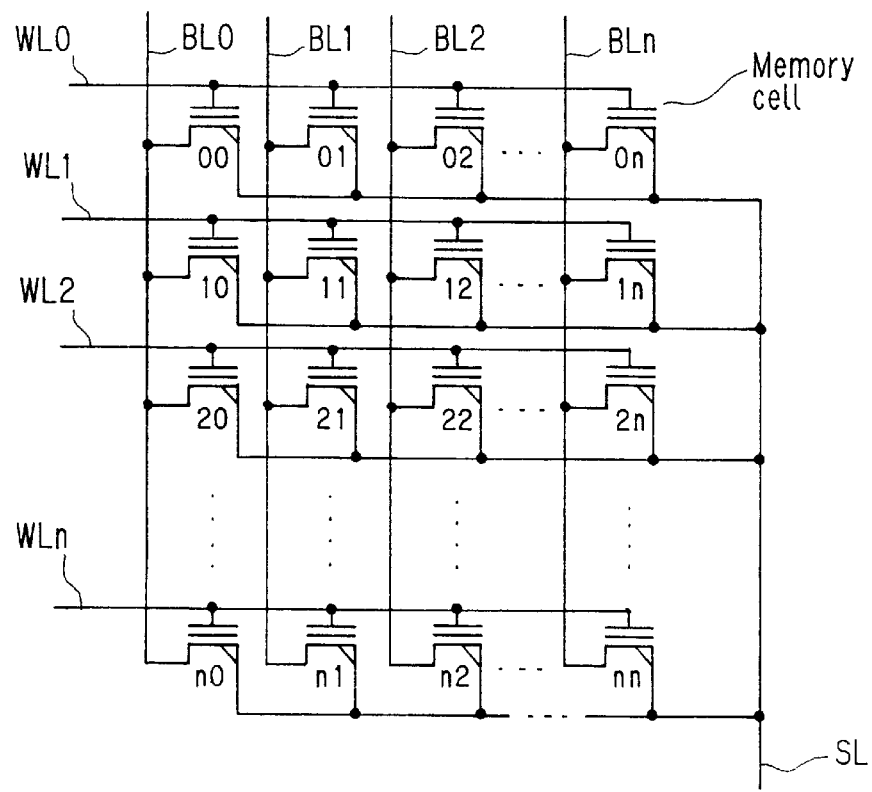
FIG. 2 is a view showing a configuration of an NOR type cell array composed of floating gate type memory cells.
Figure 3:
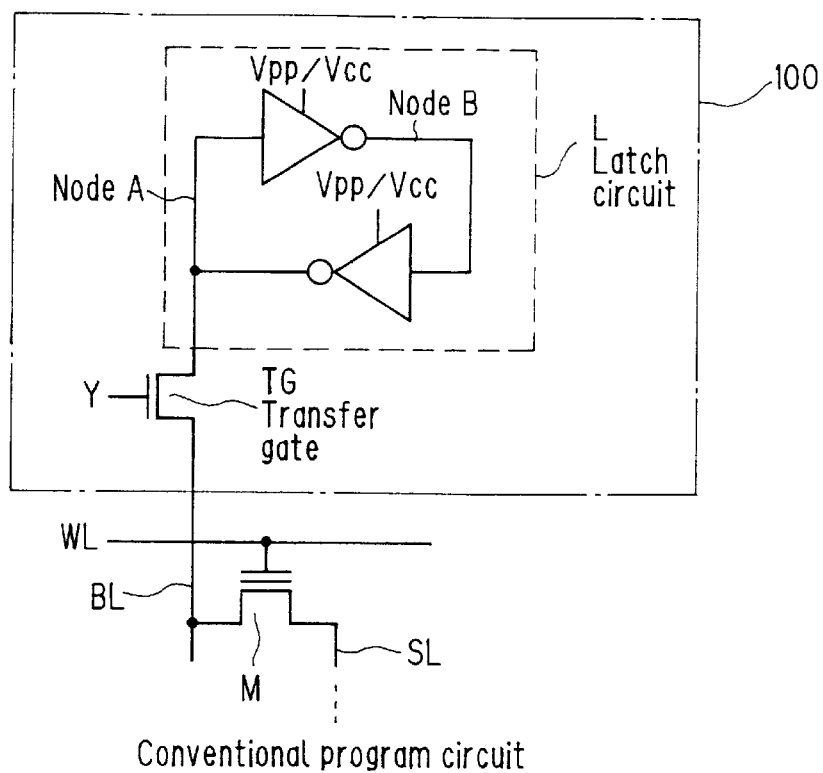
FIG. 3 is a circuit diagram showing a conventional data writing circuit.

The difference of the data writing circuit P connected to each bit line of this virtually grounded cell array from the conventional circuit 100 shown in FIG. 3, resides in that the circuit P further has a p-type transistor PM (the second conductivity type transistor), as detailedly shown in FIG. 8A. That is, the drain of a p-type transistor PM is connected to a bit line which is selected by a transfer gate TG made up of an n-type transistor (a first conductivity type transistor) while a program power source $V_{PROG}$ is applied to the source of transistor PM and the gate thereof is connected to a node B of a flip-flop constituting a latch circuit L.

Figure 5A:
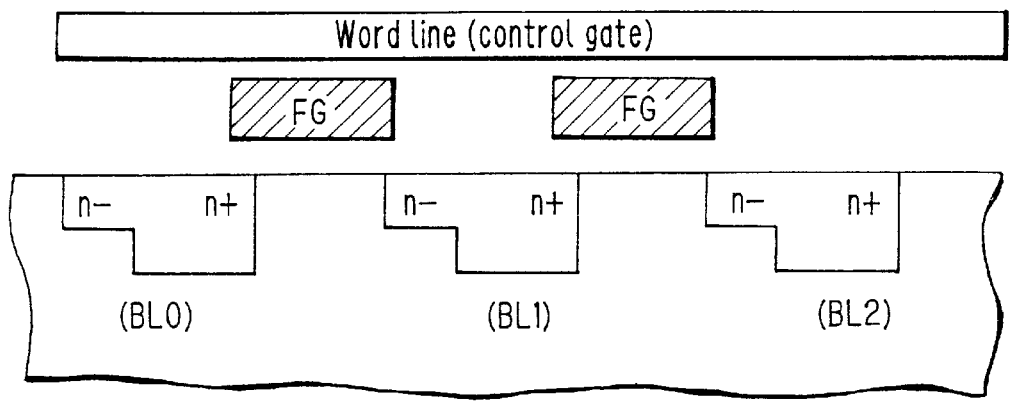
FIGS. 5A through 5C are sectional views of structure showing a memory cell which composes a virtually grounded cell array.
Figure 5B:
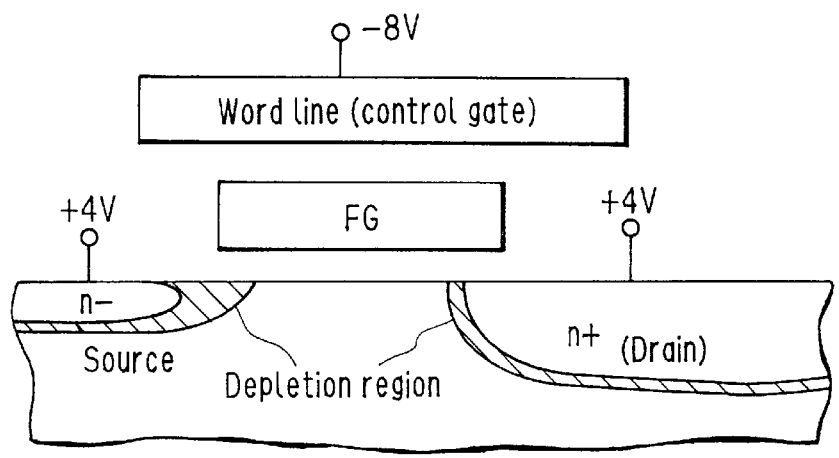
Figure 5C:
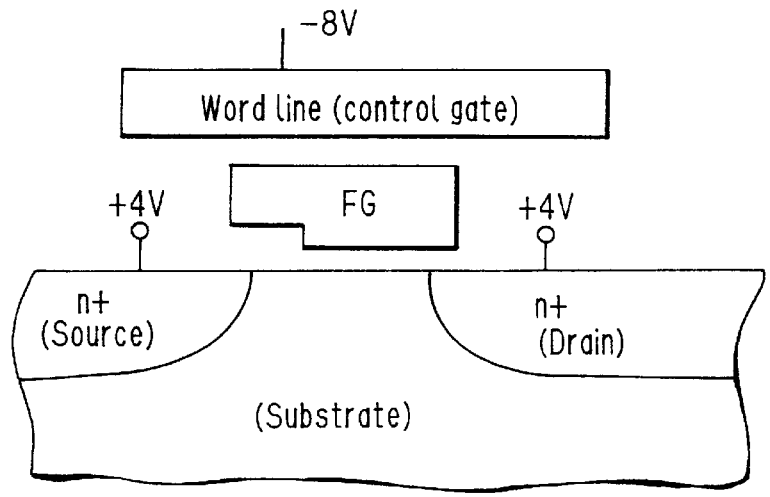
Figure 6:
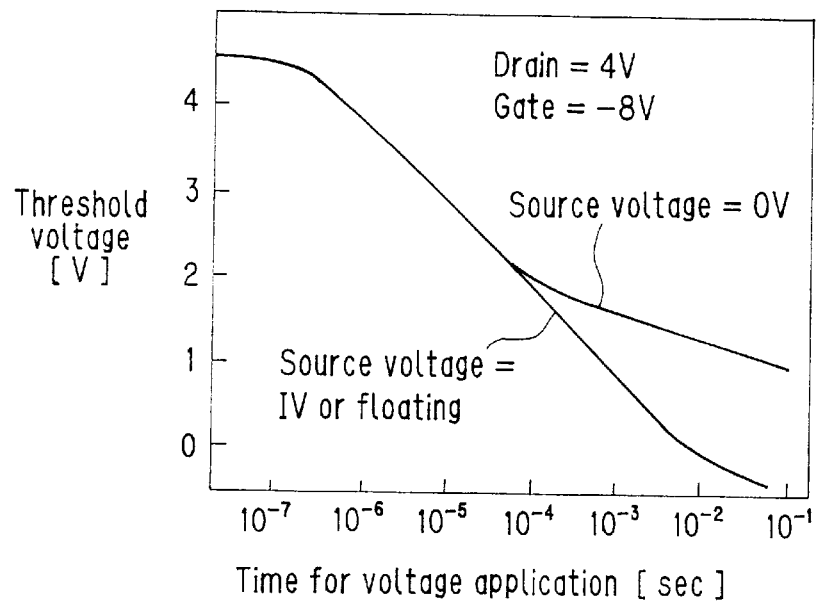
FIG. 6 is a chart showing the writing characteristics of a floating gate type memory cell.

The data writing circuit of this embodiment is applied to the aforementioned memory cells shown in FIGS. 5A and 5B or FIG. 5C having writing characteristics of insensitiveness to the source side. However, the circuit of this embodiment can be applied to any memory cells as long as it has the aforementioned characteristics and the gist of the invention should not be limited by the structure of the memory cell.

Now, the operation of data writing circuit P will be described with reference to FIG. 8A. First, in writing data, the power source for latch circuit L (inverter) is set at $V_{cc}$ (e.g. 3 V) so that latch circuit L picks up the data imparted from an unillustrated data driver circuit. In this case, when the data to be written is '1', the potential at node A (one of the stable points) of the flip-flop constituting latch circuit L becomes equal to voltage $V_{cc}$ (3 V) and the potential at node B becomes stabilized to ground voltage $V_{ss}$ (0 V), thus latch circuit latches data '1'.

On the other hand, in the case where the data to be written is '0', the potential at node A (one of the stable points) of the flip-flop constituting latch circuit L becomes equal to voltage $V_{ss}$ (0 V) and the potential at node B (the other stable point) becomes equal to the voltage $V_{cc}$ (3 V) so that the flip-flop becomes stabilized and hence latch circuit latches data '0'. Then, the power source for latch circuit L is changed from the voltage $V_{cc}$ (3 V) to the voltage $V_{pp}$ (4 V) while program power source $V_{PROG}$ is changed from ground voltage $V_{ss}$ (0 V) to voltage $V_{pp}$ (4 V).

In the above case, if the data latched by the latch circuit L is '1', ground voltage $V_{ss}$ (0 V) is imparted to the gate of transistor PM so that transistor PM will be turned on. Therefore, in this case, voltage $V_{pp}$ (4 V) is applied as program voltage $V_{PROG}$ to bit line BL. On the other hand, when the data latched by latch circuit L is '0', voltage $V_{pp}$ (4 V) is applied to the gate of transistor PM. Therefore, in this case, transistor PM will not be turned on, and bit line BL is kept floating relative to program voltage $V_{PROG}$.

Next, a further description will be made of an example in that data '1', '1', '0', ..., '0' will be written in, respectively, to memory cells $00$ to $0n$ connected to word line WL0 of the virtually grounded cell array shown in FIG. 7.

First, an unillustrated data driver circuit causes data writing circuits P connected to bit lines BL0 to BLn to latch data '1', '1', '0', ..., '0', respectively. Then, the potential of word line WL0 is reduced to a voltage $V_{nw}$ (-8 V), thereafter the power source for latch circuit L and program power source $V_{PROG}$ are changed to voltage $V_{pp}$ (4 V), so as to determine the state of conduction of transistor PM.

In this operation, only the transistors for the data writing circuits P connected to bit lines BL0 and BL1 are turned on and other transistors PM for other data writing circuits remain turned off. As a result, voltage $V_{pp}$ (4 V) is applied to bit lines BL0 and BL1 alone and other bit lines are set at floating.

Accordingly, in this case, concerning the applied voltage to each node of memory cell $00$, both the drain and source are set at voltage $V_{pp}$ (4 V) and the control gate is set at voltage $V_{nw}$ (-8 V). As stated above, in such a biased state, no channel is formed, so that the drain voltage will not lower and hence electrons are efficiently drawn from the floating gate toward the drain side. As a result, threshold voltage $V_{thc}$ of memory cell $00$ lowers to about 1 V, whereby data '1' is written in.

On the other hand, concerning the applied voltage to each node of memory cell $01$, the drain is set at voltage $V_{pp}$ (4 V), the source is floated, and the control gate is set at voltage $V_{nW}$ (-8 V). Also in this case, no channel is formed, so that the drain voltage will not lower as in the above case. Therefore, electrons are drawn from the floating gate toward the drain side, thus data '1' is written in.

Further, concerning the applied voltage to each node of memory cells $02$ to $0n$, the drain and source are floated and the control gate is set at voltage $V_{nw}$ (-8 V). In this case, no electrons are drawn from the floating gate. If that data '1' is written in to memory cell $03$ (not shown), voltage $V_{pp}$ (4 V) will be applied to bit line BL3 (not shown). Even in this case, because of the aforementioned characteristics, no electrons will be drawn from the floating gate of memory cell $02$ toward the source side (bit line BL3), so that there is no risk that data '1' is erroneously written in to memory cell $02$.

As a result, the threshold voltages of the memory cells $00$ and $01$ are reduced to about 1 V, and the threshold voltages of the other memory cells are maintained at the high level (initial state). In this way, the data writing for one line or memory cells $00$ to $0n$ is finished. In the same way, writing for the memory cells on other lines will be performed.

In the data writing circuit P of this embodiment described above, the power source for the flip-flop constituting latch circuit L is changed from voltage $V_{cc}$ (3 V) to voltage V. (4 V), in order to cut off the transistor PM. But it is also possible to use a configuration in which the source voltage is fixed at voltage $V_{cc}$ (3 V) as shown in FIG. 8B.

Next, the operation of such a latch circuit L whose power source is fixed at voltage $V_{cc}$ (3 V) will be described. When the data latched by latch circuit L is '1', ground voltage $V_{ss}$ (0 V) is applied to the gate of transistor PM and $V_{pp}$ (4 V) is applied as program power source $V_{PROG}$ to the bit line as in the aforementioned circuit shown in FIG. 8A.

On the other hand, when the data latched by the latch circuit is 10s, voltage $V_{cc}$ (3 V) is applied to the gate of transistor PM. That is, in this case, voltage $V_{cc}$ (3 V) is applied to the gate of transistor PM and voltage $V_{pp}$ (4 V) to the source thereof. Here, assumed that the threshold voltage $V_{tp}$ of transistor PM is 0.6 V as an example, transistor PM will not be cut off completely, but some current flows into bit line BL0 from the source side. Resultantly, the drain potential of transistor PM (the potential of the bit line) will gradually increase, despite the fact that data '0' is attempted to be written in.

Nevertheless, the potential of the bit line during writing data '0' to the memory cell will be stabilized lower than about 1 V, because of the fact that the bit line has a relatively large time constant resulting from the parasitic capacitance (about 10 pF) of the bit line and the fact that the write pulse is as short as 10 µs, and also considering the current-driving capacity of transistor PM, the leak current component into the diffusion layer of the memory cell and other factors. Accordingly, even with such a configuration shown in FIG. 8B, it is practically possible to write data '0' to the memory cell.

In this way, when the power source for latch circuit L is fixed, the time which would be required for the transition of the power source can be saved and the power consumption can be reduced because the voltage of the power source itself is maintained low. Further, it is possible to form latch circuit L of low voltage transistors so that the layout becomes compact.

The Second Embodiment

Figure 9:
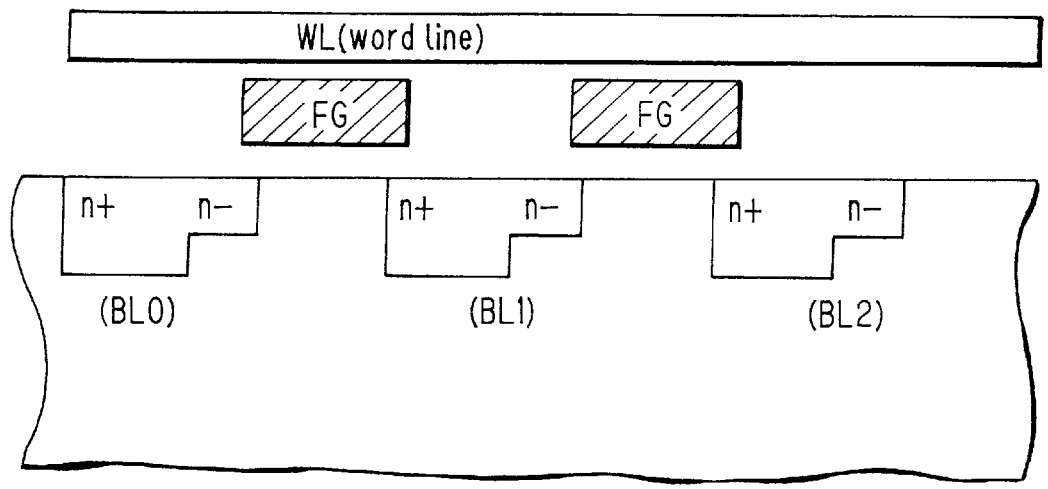
FIG. 9 is a sectional view of structure showing a memory cell to which data is written in the writing by a data writing circuit of the second embodiment.
Figure 10:
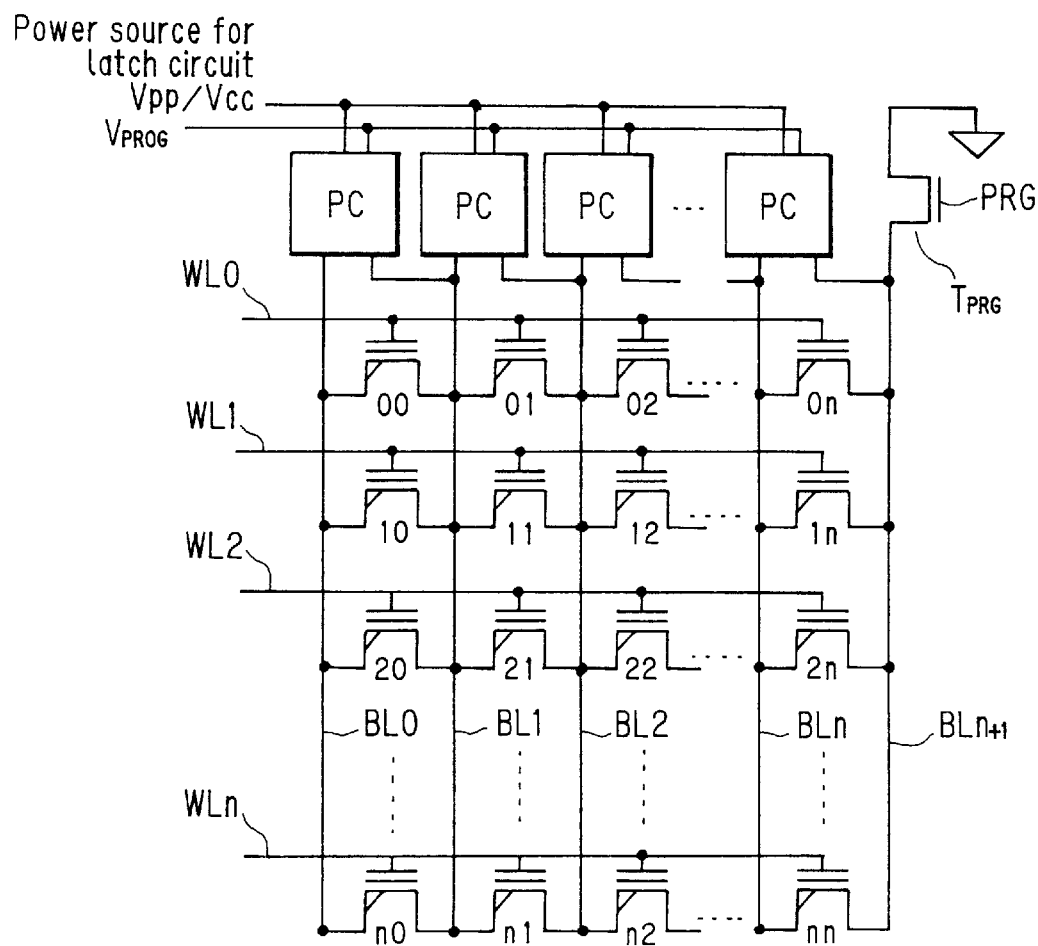
FIG. 10 is a circuit diagram showing connections of data writing circuits of the second embodiment with a virtually grounded cell array.
Figure 11:
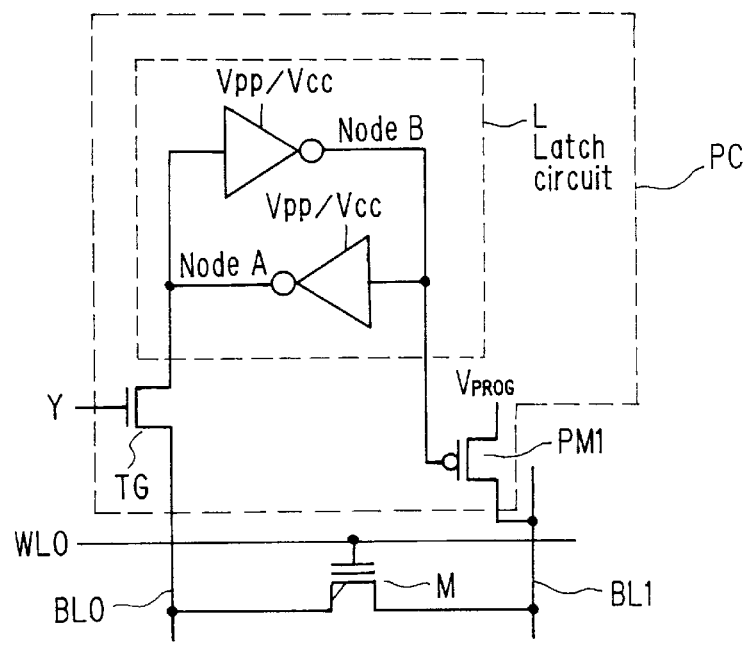
FIG. 11 is a circuit diagram showing a data writing circuit in accordance with the second embodiment.

Referring next to FIGS. 9–11, a data writing circuit of the second embodiment of the invention will be described. First, as shown in FIG. 9, the memory cell for the data writing circuit of this embodiment differs from the aforementioned circuit of the first embodiment shown in FIGS. 5A to 5C, in that the roles of the source and the drain are changed to each other, or writing is performed from the source side and readout from the drain side, and further, with respect to the writing operation, the memory cell has characteristics of insensitiveness to the drain voltage. Further, in this model, since the dopant concentration is low on the drain side to which a voltage of 1 V is applied when data is read out, the disturbance (soft write) during the readout operation can be alleviated.

As shown in FIG. 10, a data writing circuit PC of this embodiment is provided to each bit line of a virtually grounded cell array formed of the thus configured memory cells M, to perform data writing from the source side of each memory cell M. Actually, data writing circuit PC of this embodiment, as detailedly shown in the circuit of FIG. 11, a transistor PM 1 is provided in place of transistor PM in the circuit of FIG. 8A, and the drain of this transistor PM1 is connected to the bit line next to the bit line to which data writing circuit PC is connected, or to the one to which the source of memory cell M is connected.

Using the data writing circuit of this embodiment thus configurated, when data '1' is written in to memory cell 00 shown in FIG. 10, at the beginning latch circuit L shown in FIG. 11 of data writing circuit PC to which bit line BL0 is connected latches data '0' In this case, ground voltage $V_{ss}$ (0 V) is applied to the gate of transistor PM1 so that it is turned on. As a result, voltage $V_{pp}$ (4 V) is applied as program power source $V_{PROG}$ to the source of memory cell 00 (bit line BL1).

At this moment, if the drain of memory cell 00 (bit line BL0) is floating, or has a voltage of about 1 V or more, no channel will form in memory cell 00 as stated above, the potential of the drain is maintained at $V_{pp}$ (4 V). Accordingly, in this case, a high electric field is formed between the floating gate and the source of memory cell 00 so that electrons are drawn from the floating gate toward the source, thus data '1' is written in to memory cell 00.

On the other hand, in the case where the write data is '0', 4 V is applied to the gate of transistor PM1 constituting this data writing circuit PC, so that it is deactivated and hence the source of memory cell 00 (bit line BL1) is set into floating state. Accordingly, in this case, no electrons are drawn from the floating gate of memory cell 00, and hence the initial data '0' is maintained.

The Third Embodiment

Now, referring to FIG. 12, description will be made of a data writing circuit of the third embodiment of the invention. A data writing circuit PD of this embodiment shown in FIG. 12, differs from the aforementioned data writing circuit P of the first embodiment shown in FIG. 8A, in that an n-type transistor NM is further provided. The drain of this transistor NM is connected to the bit line in common with the drain of transistor PM and a program prohibition power source $V_{PROGN}$ of about 1 V is applied to its source while its gate is connected in common with the gate of transistor PM to node B of a flip-flop constituting latch circuit L. The memory cells to be targeted in this embodiment are of a type shown in FIGS. 5A to 5C for the circuit of the first embodiment (the type in which data is written in from the drain side).

Hereinbelow, description will be made of the operation of data writing circuit PD of this embodiment, focusing the difference from the circuit P of the first embodiment shown in FIG. 8A. In the first embodiment, the bit line was set in floating when data '0' was to be written in, but in this embodiment program prohibition voltage $V_{PROGN}$ (about 1 V) is applied via transistor NM to the bit line so as to prohibit the adjoining memory cell whose source is connected to this bit line, from forming a channel, thus promoting the writing of data '1' to this adjoining memory cell.

Now, the operation of writing data '1' and '0' to memory cells 00 and 01, respectively in data writing circuit PD will be described with reference to FIG. 7 in which data writing circuits P is assumed to be replaced with circuits PD.

In this case, the data writing circuits PD which is connected to bit lines BL0 and BL1 latch data '1' and '0', respectively. In this operation, since ground voltage (0 V) is applied to both the gates of transistors PM and NM constituting the data writing circuit PD connected to bit line BL0, transistor PM is turned on while transistor NM is turned off. As a result, voltage $V_{pp}$ (4 V) is applied as program voltage $V_{PROG}$ via transistor PM to bit line BL0, thus data '1' is written in to memory cell 00.

On the other hand, since voltage $V_{pp}$ (4 V) is applied to the gates of transistors PM and NM constituting the data writing circuit PD connected to bit line BL1, transistor PM is turned off while transistor NM is turned on. As a result, program prohibition voltage $V_{PROGN}$ (about 1 V) is applied via transistor NM to bit line BL1, thus data '0' in memory cell 01 is maintained (data '0' is written in to memory cell 01).

In this case, since the potential of bit line BL1 connected to the drain of memory cell 01 to which data '0' is written in is forcibly maintained at the voltage of program prohibition power source (about 1 V), the adjacent memory cell 00 whose source is connected to bit line BL1 is fixed in cut-off state from the beginning of the writing operation. Therefore, the writing of data '1' to memory cell 00 is promoted without the drain voltage of memory cell 00 being lowered.

Figure 12:
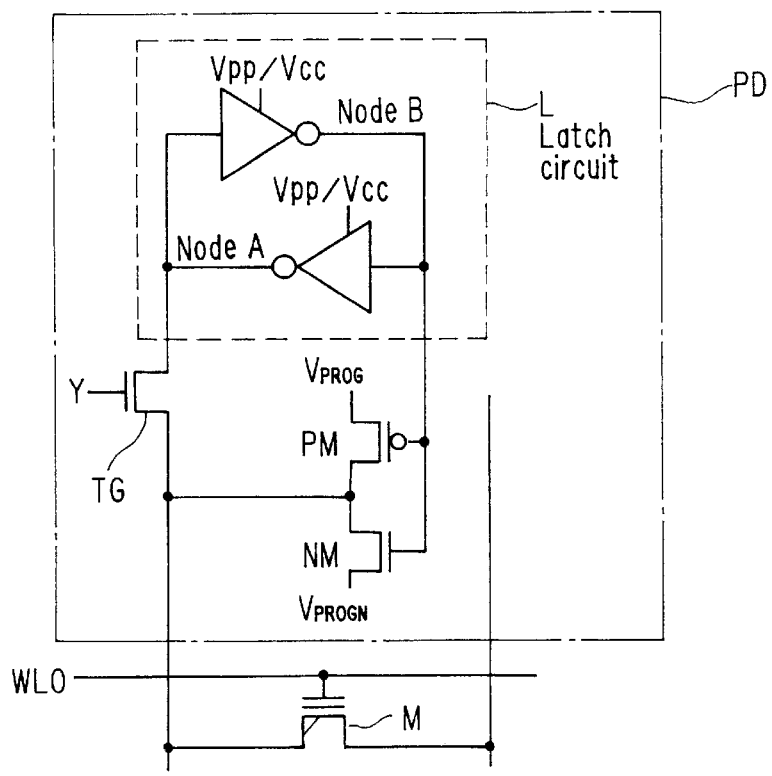
FIG. 12 is a circuit diagram showing a data writing circuit in accordance with the third embodiment.

When an element corresponding to transistor NM shown in FIG. 12 is added to the circuit configuration shown in FIG. 11, it is also possible to promote the writing of data '1' to the adjacent memory cell to that to which data '0' is written in.

The Fourth Embodiment

Next, with reference to FIGS. 13A and 13B, a data writing circuit PE of the fourth embodiment of the invention will be described. The aforementioned circuit PB shown in FIG. 8B is configured such that a small current is allowed to flow through transistor PM when data '0' is written in the compensation for fixing the power source voltage in the flip-flop constituting the latch circuit L, at voltage $V_{cc}$. On the other hand, in the circuit PE of this embodiment shown in FIG. 13A, even if the power source for the flip-flow constituting latch circuit L is fixed at voltage $V_{cc}$, transistor PM is adapted to be cut off completely during wiring data '0'.

Figure 13A:
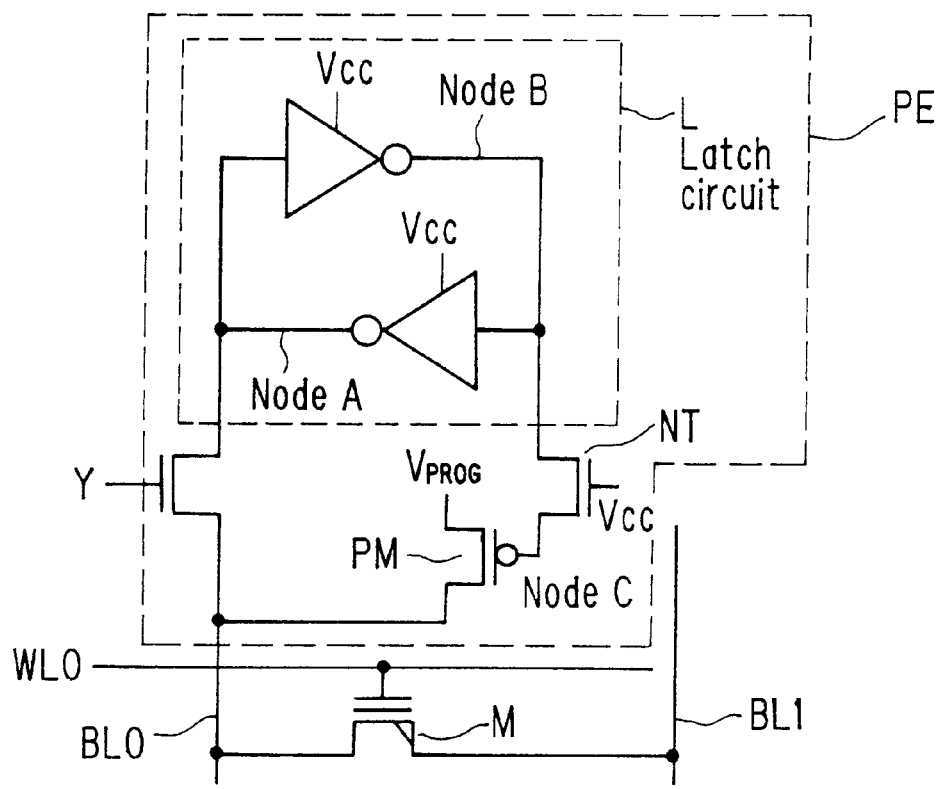
FIG. 13A is a circuit diagram showing a data writing circuit in accordance with the fourth embodiment.
Figure 13B:
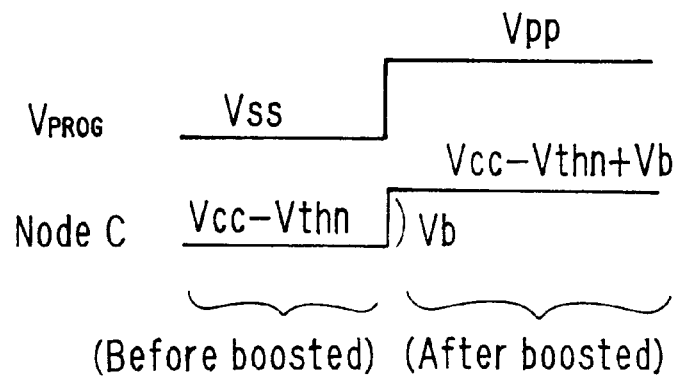
FIG. 13B is a chart showing waveforms for explaining the operation of a data writing circuit in accordance with the fourth embodiment.

More specifically, data writing circuit PE of this embodiment shown in FIG. 13A, has the circuit configuration of FIG. 8B in which a transistor NT with its gate connected to the voltage $V_{cc}$ is provided between the gate of transistor PM and node B of the flip-flop constituting the latch circuit L, forming a self-boosting circuit. In this way, the circuit is configured so that transistor PM is totally cut off when data to be written in is '0'.

Illustratively, in the case where data '0' is written in to memory cell 00 shown in FIG. 13A, when latch circuit L latches data '0', voltage $V_{cc}$ (3 V) appears at node B. At the same time, voltage $V_{cc}$ (3 V) is applied to the gate of transistor NT, therefore transistor NT is cut off against a signal which exceeds a predetermined value (=(voltage $V_{cc}$)−(threshold voltage $V_{thn}$ of transistor NT)). As a result, the voltage ($V_{cc}-V_{thn}$) (which is dropped by $V_{thn}$ from the potential at node B) appears at the gate (node C) of transistor PM. (This is shown as the state before being boosted in FIG. 13B).

Next, program power source $V_{PROG}$ is raised from ground voltage $V_{ss}$ (0 V) to voltage $V_{pp}$ (4 V), the potential at node C is boosted by a coupling capacitance $C_b$ between the gate and source of transistor PM (self-boosting effect), to a voltage (=(voltage $V_{cc}$)−(threshold voltage $V_{thn}$ of transistor NT)+(boosting voltage $V_b$: $V_b$ is a voltage increase due to the boost, and determined by the relationship between coupling capacitance $C_b$ and other parasitic capacitance)). (This state is shown as the state after being boosted in FIGS. 13A and 13B). As a result, the gate voltage relative to the source in transistor PM becomes equal to or below its threshold voltage, so that transistor PM is totally cut off. This causes the bit line to be floating with respect to program power source voltage $V_{PROG}$, and data '0' is written in to memory cell M.

When data '1' is written in to memory cell M, latch circuit L picks up data '1', ground voltage $V_{ss}$ (0 V) appears at node B. At the same time, since voltage $V_{cc}$ (3 V) is applied to the gate of transistor NT, the voltage of 0 V on the source side appears as it is at node C, thus the gate of transistor PM is set at ground voltage $V_{ss}$ (0 V). Accordingly, the transistor PM in this case is biased similarly to the transistor PM constituting the circuit shown in FIG. 8B, whereby data '1' is written in to memory cell M.

Since in the data writing circuit PE of this embodiment, transistor PM is totally cut off by self-boosting, it is no longer necessary to change the level of the power source for the latch circuit to voltage $V_{pp}$, thus saving the time required for transition of the power source for latch circuit L and reducing the power consumption. Further, it is possible to form latch circuit L of low voltage transistors alone, so that the layout area in whole can be made compact though extra transistor NT is needed as compared to the configuration shown in FIGS. 13A and 13B.

As is apparent from the above description, according to the invention the following effects can be obtained.

According to the first or fifth aspect of the invention, since the circuit of the invention is constructed so that one of the program power source or floating state is set up for the bit lines in accordance with the state of the writing data, it is possible to effectively write data into a memory cell as an element of a virtually grounded cell array without disturbing the operation of writing to the adjacent memory cell.

According to the second or sixth aspect of the ainvention, since the circuit of the invention is constructed so that one of the program power source or floating state is set up for the bit lines in accordance with the state of the writing data, it is possible to have the same effect obtained from the above first or fifth feature of the invention, even in the case where a virtually ground cell array is constructed of memory cells to which data is written in from the source side.

According to the third feature of the invention, since the circuit of the invention is constructed so that one of the program power source (the first program power source) or the program prohibition voltage (the second program power source) is set up for the bit lines in accordance with the state of the writing data, it is possible to further effectively write data into a memory cell as an element of a virtually grounded cell array without disturbing the operation of writing to the adjacent memory cell from the beginning of the writing operation.

According to the fourth aspect of the invention, since the circuit of the invention is constructed so that one of the program power source or the program prohibition voltage is set up for the bit lines in accordance with the state of the writing data, it is possible to have the same effect obtained from the above third feature of the invention, even in the case where a virtually ground cell array is constructed of memory cells to which data is written in from the source side.

According to the seventh or eighth feature of the invention, since the circuit of the fifth or sixth feature is modified in such a manner that the transistor for supplying the program power source to the bit lines will cut off the current by the self-boosting effect, it is possible to operate the latch circuit at a low voltage, and hence achieve a low consumption of electric energy.

In conclusion, according to the present invention, in the operation of writing data into a flash memory having a virtually grounded cell array using the FN current, it is possible to shift the threshold voltage of the memory cell to a level which allows sufficiently stable readout, and still it is possible to achieve a high speed operation of data writing.

What is claimed is:

1. A data writing circuit for a nonvolatile semiconductor memory comprising a virtually grounded NOR cell array composed of floating gate type memory cells in which data is written in and erased based on the Fowler-Nordheim tunnel effect, comprising:

a transfer gate selecting a bit line of the virtually grounded cell array;

a latch circuit connected to the bit line via the transfer gate for latching the data to be written, given to the bit line; and a switching circuit which is connected between the bit line and a program power source and is activated in accordance with the write data which has been latched by the latch circuit, to thereby supply the program power source to the bit line.

2. A data writing circuit for a nonvolatile semiconductor memory comprising a virtually grounded NOR cell array composed of floating gate type memory cells in which data is written in and erased based on the Fowler-Nordheim tunnel effect, comprising:

a transfer gate selecting a first bit line of the virtually grounded cell array;

a latch circuit connected to the first bit line via the transfer gate for latching the data to be written, given to the first bit line; and a switching circuit which is connected between a second bit line adjacent to the first bit line and a program power source and is activated in accordance with the data to be written which has been latched by the latch circuit, to thereby supply the program power source to the second bit line adjacent to the first bit line.

3. A data writing circuit for a nonvolatile semiconductor memory comprising a virtually grounded cell array composed of floating gate type memory cells in which data is written in and erased based on the Fowler-Nordheim tunnel effect, comprising:

a transfer gate selecting a bit line of the virtually grounded cell array, the transfer gate being composed of a first conductivity type transistor which is connected at one of either the source or the drain thereof to the bit line;

a latch circuit connected to the bit line via the transfer gate for latching the data to be written, given to the bit line, the latch circuit being composed of a flip-flop, of which a first stable point of two is connected to the other of the source and the drain of the first conductivity type transistor; and a switching circuit which selects a first or second program power source in accordance with the data to be written which has been latched by the latch circuit, to thereby supply the selected program power source to the bit line, the switching circuit being composed of a second conductivity type transistor of which the source and drain are connected to at least one of the first and second program power sources and the bit line, respectively, the gate being connected to the second stable point of the flip-flop.

4. A data writing circuit for a nonvolatile semiconductor memory comprising a virtually grounded NOR cell array composed of floating gate type memory cells in which data is written in and erased based on the Fowler-Nordheim tunnel effect, comprising:

a transfer gate selecting a first bit line of the virtually grounded cell array;

a latch circuit connected to the first bit line via the transfer gate for latching the data to be written, given to the first bit line; and a switching circuit which selects a first or second program power source in accordance with the write data which has been latched by the latch circuit, to thereby supply the selected program power source to a second bit line adjacent to the first bit line.

5. A data writing circuit for a nonvolatile semiconductor memory comprising a virtually grounded cell array composed of floating gate type memory cells in which data is written in and erased based on the Fowler Nordheim tunnel effect, comprising:

a transfer gate selecting a bit line of the virtually grounded cell array, the transfer gate being composed of a first conductivity type transistor which is connected at one of either the source or the drain thereof to the bit line;

a latch circuit connected to the bit line via the transfer gate for latching the data to be written, given to the bit line, the latch circuit being composed of a flip-flop, of which a first stable point of two is connected to the other of the source and the drain of the first conductivity type transistor; and a switching circuit which is connected between the bit line and a program power source and is activated in accordance with the write data which has been latched by the latch circuit, to thereby supply the program power source to the bit line, the switching circuit being composed of a second conductivity type transistor of which the source and drain are connected to the program power source and the bit line, respectively, the gate being connected to the second stable point of the flip-flop.

6. A data writing circuit for a nonvolatile semiconductor memory comprising a virtually grounded cell array composed of floating gate type memory cells in which data is written in and erased based on the Fowler-Nordheim tunnel effect, comprising:

a transfer gate selecting a first bit line of virtually grounded cell array, the transfer being composed of a first conductivity type transistor which is connected at one of either the source or the drain thereof to the bit first line;

a latch circuit connected to the first bit line via the transfer gate for latching the data to be written, given to the first bit line, the latch circuit being composed of a flip-flop, of which a first stable point of two is connected to the other of the source and the drain of the first conductivity type transistor; and a switching circuit which is connected between a second bit line adjacent to the first bit line and a program power source and is activated in accordance with the data to be written which has been latched by the latch circuit, to thereby supply the program power source to the second bit line adjacent to the first bit line, the switching circuit being composed of a second conductivity type transistor of which the source and drain are connected to the program power source and the second bit line adjacent to the first bit line, respectively, the gate being connected to the second stable point of the flip-flop.

7. The data writing circuit for a nonvolatile semiconductor memory according to claim 5, further comprising: a transistor between the gate of the second conductivity type transistor constituting the switching circuit and the second stable point of the flip-flop constituting the latch circuit, the transistor being cut off against a signal which exceeds a predetermined level of voltage, wherein the self-boosting effect which appears in accordance with the transition of the program power source imparted to the source of the second conductivity type transistor is used to raise the potential of the gate of the second conductivity type transistor to a predetermined level of voltage or higher to thereby cut off the second conductivity type transistor.

8. The data writing circuit for a nonvolatile semiconductor memory according to claim 6, further comprising: a transistor between the gate of the second conductivity type transistor constituting the switching circuit and the second stable point of the flip-flop constituting the latch circuit, the transistor being cut off against a signal which exceeds a predetermined level of voltage, wherein the self-boosting effect which appears in accordance with the transition of the program power source imparted to the source of the second conductivity type transistor is used to raise the potential of the gate of the second conductivity type transistor to a predetermined level of voltage or higher to thereby cut off the second conductivity type transistor.

* * * * *